United States Patent [19]
Baggen et al.

[11] Patent Number: 5,471,486
[45] Date of Patent: Nov. 28, 1995

[54] METHODS AND DEVICES FOR ENCODING DATA SYMBOLS IN ACCORDANCE WITH A BCH CODE TO OBTAIN A CODE WORD IN WHICH PARITY SYMBOLS ARE LOCATED IN THE MIDDLE OF THE CODE WORD

[75] Inventors: Constant P. M. J. Baggen; Erik W. Gaal, both of Eindhoven, Netherlands

[73] Assignee: U.S. Philips Corporation, New York, N.Y.

[21] Appl. No.: 385,397

[22] Filed: Feb. 7, 1995

Related U.S. Application Data

[63] Continuation of Ser. No. 107,547, Aug. 17, 1993, abandoned.

[30]  Foreign Application Priority Data

Aug. 21, 1992 [EP]  European Pat. Off. .............. 92202562

[51] Int. Cl.[6] ...................................................... G06F 11/10
[52] U.S. Cl. ......................................... 371/37.1; 371/37.5
[58] Field of Search .................................. 371/37.1, 37.5, 371/37.4, 37.7, 40.1, 48, 51.1, 49.1, 49.2

[56]  References Cited

U.S. PATENT DOCUMENTS 4,413,340  11/1983  Odaka et al. ................................ 371/39
5,226,043   7/1993  Pughe, Jr. et al. ...................... 371/40.1

*Primary Examiner*—Robert W. Beausoliel, Jr.
*Assistant Examiner*—Phung My Chung
*Attorney, Agent, or Firm*—Richard A. Weiss

[57]  ABSTRACT

Methods and devices for encoding data symbols in accordance with a BCH code to obtain a code word in which parity symbols are located in the middle of the code word. The data symbols are supplied to a parity determining device in a predetermined order to produce the parity symbols, which parity determining device either employs a shift register or a shift register bank. When the parity determining device employs a shift register, depending upon the predetermined order in which the data symbols are supplied to the shift register, the data symbols are either (a) forward shifted through the shift register, after each data symbol has been initially modified on the basis of previously supplied data symbols, and further modified as each is being shifted through the shift register on the basis of subsequently received data symbols so as to produce the parity symbols or (b) forward shifted through the shift register, after each data symbol has been modified on the basis of previously supplied data symbols, so as to produce provisional parity symbols which are, in turn, backward shifted through the shift register to produce the parity symbols. Once the parity symbols have been produced, they are positioned among the data symbols so as to produce the code word.

26 Claims, 3 Drawing Sheets

METHODS AND DEVICES FOR ENCODING DATA SYMBOLS IN ACCORDANCE WITH A BCH CODE TO OBTAIN A CODE WORD IN WHICH PARITY SYMBOLS ARE LOCATED IN THE MIDDLE OF THE CODE WORD

This is a continuation of prior application Ser. No. 08/107,547, filed on Aug. 17, 1993, now abandoned.

BACKGROUND OF THE INVENTION

The invention relates generally to the encoding of data symbols in accordance with BCH codes, and in particular, Reed-Solomon codes, to produce code words.

In particular, the invention relates to obtaining the parity symbols for such code words. The symbol width of the symbols used in the code words of BCM codes may be one bit, in which case the subfield of the symbols is the Galois field GF(2). Such BCM codes are excellent for error protection against single-bit errors, such as may occur in optical fiber communication. An alternative to one-bit-symbol BCH codes are those with multibit symbols.

Generally, each particular BCH code has a maximum code word length. For practical purposes, shortened code words are used, i.e., predetermined symbols in a code word get assigned a zero value, and are not effectively stored, transmitted or otherwise used. Hereinafter, such shortened code words are also called BCH code words. Full-length BCH code words are cyclical, i.e., symbolwise cyclical transposition of a code word, will produce another code word. Such cyclical transposition keeps the random error correctability unchanged. However, burst error correctability may be influenced if a shortened code word is used.

A subclass of multibit symbol BCH codes are Reed-Solomon codes, for which the maximum code word length is given by $N=2^m-1$, m being the number of bits per symbol. Reed-Solomon (RS) codes are excellent for protection against burst errors. A well-documented use of Reed-Solomon codes is in Compact Discs, which use has been disclosed in U.S. Pat. No. 4,413,340, which was assigned to Sony Corporation. The error protection used consists of C1 code words of a (32,28,5) code and C2 code words of a (28,24,5) code. Currently and conventionally, a consumer CD-system is a decoder-only type. However, a need has been felt for a hardware-efficient encoder, particularly in view of envisaged introduction of write-once and rewritable versions of Compact Discs, and also of other applications.

SUMMARY OF THE INVENTION

It is an object of the invention, inter alia, to provide a method and device for encoding data symbols in accordance with single-bit or plural-bit symbols BCM codes, and in particular, for encoding data symbols in accordance with Reed-Solomon codes, the code words being either full-length or shortened code words. The invention envisages encoding where a series of parity symbols is interposed between a first portion and a second portion of data symbols. A secondary object is that the hardware should be nearly identical to that used for "normal" code words where the parity symbols are in the final positions of the code words. Especially in a CD-environment, this would allow encoding of both types of codes with the same hardware.

Those objects can be realized by a method, in accordance with the invention, in which the data symbols are presented to a parity determining device in a predetermined order to obtain the parity symbols for a code word having a code word order in which the parity symbols are interposed between a first portion of the data symbols and a second portion of the data symbols, and positioning the parity symbols with respect to the data symbols in accordance with the code word order. The predetermined order is either (a) a first predetermined order in which the second portion precedes the first portion and zero data symbols are located in between the second portion and the first portion, or (b) a second predetermined order in which the first portion precedes the second portion and a number of dummy symbols (corresponding to the number of parity symbols to be included in the code word) are located in between the first portion and the second portion.

The invention utilizes shift registers (or in one embodiment a shift register bank) or their emulations, not matrix multiplication, in determining the parity symbols. Presenting the data symbols to a parity determining device in accordance with either of the above-mentioned predetermined orders is very hardware efficient, in particular, inasmuch as it allows data symbols or parity symbols which may be included in the code word to be replaced by a zero or other dummy symbol. After all data symbols have been presented to the parity determining device, their contributions to the parity symbols are fully known and the parity symbols can be obtained. Thereafter, all that is required is that the parity symbols and the data symbols be properly positioned with respect to one another in accordance with the code word order.

With respect to an embodiment of the method employing the first predetermined order (described above), what the parity determining device (in this case employing use of a shift register) obtains via supplying the data symbols thereto serially in accordance with the first predetermined order is the actual parity symbols for the code word. Therefore, all that is required thereafter is that the parity symbols be positioned correctly with respect to the data symbols in accordance with the code word order. No additional hardware is required as compared with normal encoding, except for the addition of a positioning device. The only disadvantage of this embodiment is that it takes too much time, in particular for code words which have been shortened substantially and in which the parity symbols are to be included in the middle of the code word.

With respect to an embodiment of the method employing the second predetermined order (described above), what the parity determining device obtains, when the device employs use of a shift register, directly via supplying the data symbols thereto in accordance with the second predetermined order is provisional parity symbols which, although they are related to the parity symbols for the code word, they are not the parity symbols for the code word. The parity symbols for the code word can be derived from the provisional parity symbols by backward shifting the provisional parity symbols through the shift register, such backward shifting occurring as many times as the provisional parity symbols are offset from the last data symbol of the code word. For code words in which the parity symbols are to be located between the middle of the code word and the end of the code word, use of this second order is preferred. However, it should be noted that this embodiment of the method requires additional hardware and addition control, both with respect to the backward shifting of the provisional parity symbols, and with respect to the environment of the encoder. Nevertheless, it is possible to eliminate the need for backward shifting to obtain the parity symbols by utilizing a shift register bank as the parity determining device.

The invention also relates to a device for implementing the method as described above. It has been found that such a device should be flexible, and require minimal hardware. As to the encoding capability in particular, inter alia, the following objects and parameters are relevant:

1. In the Compact Disc convention, as well as in others, it is desirable to use identical hardware to implement different codes provided that their parity check matrices were closely resembling each other.

2. In particular, it is desirable to be able to position the parity symbols on arbitrary positions within the code word, with a restriction that their positions be contiguous.

3. Given the maximum length N of the code words in view of the symbol length chosen, and the actual length n of the code words, a first variable parameter is the shortening of the code word with respect to a non-shortened code (N−n).

4. A second parameter is the temporal sequence wherein the data symbols are presented to the input of the device.

According to the invention, object #1 is attained through appropriate choice of parameter #4. On the other hand, for relatively short code words (parameter #3 is large) the operation is slow, in particular, just as slow as for non-shortened code words.

BRIEF DESCRIPTION OF THE DRAWINGS

Various aspects and advantages of the invention are described hereinafter in detail with reference to the drawings, in which.

DESCRIPTION OF THE PREFERRED EMBODIMENTS

Figure 1A:
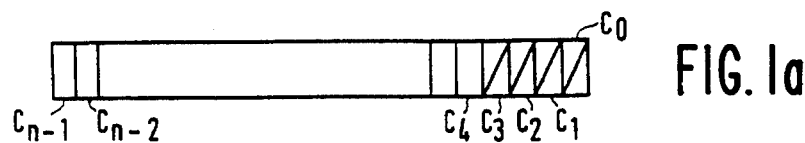
FIGS. 1a–1e show various coding configurations.

FIGS. 1a–1e show various coding configurations. FIG. 1a diagrammatically shows a code word. Generally, in code words of block codes or systematic codes, parity symbols are in the low order positions $c_j \ldots c_o$, where $j < n-1$. For a Compact Disc, this is true for code words of the so-called C1 code (regular encoding), but not for code words of the C2 code (non-regular encoding). In accordance with the invention, the parity positions of code words are not in the low-order positions (non-regular encoding). Nevertheless, in accordance with the invention, the encoding is easy and straightforward, and does not require parallel matrix multiplication. (The latter has been found complicated and expensive, in terms of the number of gates required.)

Figure 1B:
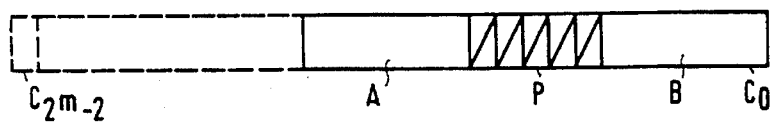

FIG. 1b diagrammatically shows a code word format that the present invention envisages to encode. For a Reed-Solomon code of m-bit symbols, the maximum length of such a code word is $2^m-1$ symbols. In the code word of FIG. 1b (an unshortened code word) the symbols numbered from $C_2m_{-2} \ldots C_o$, comprise data symbols, included in parts A and B of the code word, parity symbols, included in an intermediate part P. The lengths of A, P and B are arbitrary provided such that $A+B+P \leq 2^m-1$. As explained elsewhere, the unshortened code word is cyclical, i.e., any rotation of the code word (on a symbol basis) produces another code word.

Figure 1C:
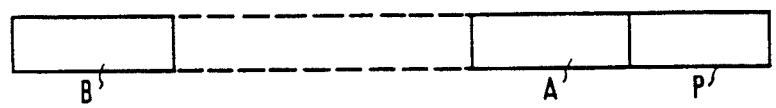

FIG. 1c shows such another code word, i.e., the code word of FIG. 1b rotated (on a symbol basis) such that the parity symbols P occupy the final positions; and, as such, illustrates a first encoding scheme for use in obtaining a code word such as the code word of FIG. 1b. Specifically, if the code word of FIG. 1c can be produced from the data symbols, then the code word of FIG. 1b can be obtained by rotating the parity symbol with respect to the data symbols. Hence, the order of the data symbols of FIG. 1c can be used to get the parity symbols for FIG. 1b.

For a code word of the C2 code of the Compact Disc, part B has the symbols $C_{11} \ldots C_o$, part A has symbols $C_{27} \ldots C_{16}$ and part P has symbols $C_{15} \ldots C_{12}$. The non-used part has 255−28=227 symbols. As a result, 255 clock pulses are needed to get the parity symbols, but requires very little hardware. Accordingly, after part B has been presented to a parity determining device (and before part A is presented to the device), a series of 227 dummy zeroes is presented to the parity determining device.

Figure 1D:
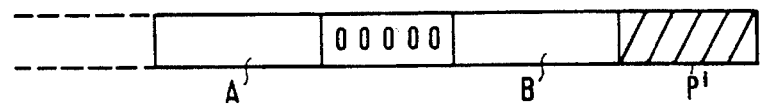

FIG. 1d shows diagrammatically a second scheme for obtaining a code word such as the code word of FIG. 1b. Inasmuch as the symbols before part A of FIG. 1b are essentially zeroes, they do not contribute to the parity symbols. As a result, first part A can be presented to a parity determining device. Next, for each intended parity symbol, a dummy symbol (e.g., zero) can be presented to the parity determining device. Next, part B can be presented to the parity determining device. After part B has been presented to the parity determining device, P provisional parity symbols are generated and available for notional positions P' of FIG. 1d, just as in regular encoding, where parity symbols are available for use in the low order positions. However, those provisional parity symbols do not have the correct values for the intended parity symbols to be located in the positions P of the intended code word of FIG. 1b. The values of the provisional parity symbols have been multiplied too many times with respect to coefficients of a polynomial used to generate them. In other words, they are mathematically offset as indicated by the offset between the positions for which they were generated, i.e., the notational positions P' of FIG. 1d, and the intended positions of the intended parity symbols of the code word of FIG. 1b, i.e., the positions P. For example, if the provisional parity symbols had been generated one symbol period later, this means that the offset is one symbol position higher.

Figure 1E:
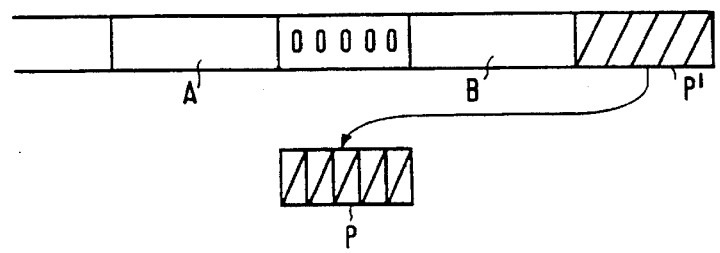

Generating the intended parity symbols, therefore, boils down to updating the provisional parity symbols through multiplication by $x^{-(B+P)}$ mod $g(x)$, wherein B+P is the offset from the notational positions P' for which those provisional parity symbols were generated to the positions P in which the intended parity symbols for code word of FIG. 1b are to be located, and $g(x)$ is the generator polynomial of the code. This is effected by having the parity determining device shift backwards over the lengths of parts P' and B combined as indicated by FIG. 1e. In terms of a Compact Disc, this means a backwards shift over 12+4=16 symbol positions:

$P = (x^{-16} i(x) \mod g(x)) \mod g(x) = x^{-16} P' \mod g(x)$ As explained hereinafter, this can be done in two ways: one with plain back-shifting (see FIG. 5) and one with use of a finite state machine (see FIG. 6). Both realizations have their respective advantages. Thereafter, the code word of FIG. 1b can be obtained by positioning the correct parity symbols with the data symbols in accordance with the configuration of FIG. 1b.

The Compact Disc system has two codes C1 and C2, which are both shortened Reed-Solomon (RS) codes over $GF(2^8)$ and have the same generator polynomial $g(x)=(x-1)(x-\alpha)(x-\alpha^2)(x-\alpha^3)=x^4+\alpha^{75}x^3+\alpha^{249}x^2+\alpha^{78}+\alpha^6$. The primitive polynomial has been chosen as $p(x)=x^8+x^4+x^3+x^2+1$, and $\alpha$, which is a root of $p(x)$ is the primitive element. Both codes have a parity check matrix with the following structure:

$$H_n = \begin{pmatrix} 1 & 1 & \ldots & 1 & 1 & 1 \\ \alpha^{n-1} & \alpha^{n-2} & \ldots & \alpha^2 & \alpha & 1 \\ (\alpha^2)^{n-1} & (\alpha^2)^{n-2} & \ldots & (\alpha^2)^2 & \alpha^2 & 1 \\ (\alpha^3)^{n-1} & (\alpha^3)^{n-2} & \ldots & (\alpha^3)^2 & \alpha^3 & 1 \end{pmatrix}$$

where n=32 for C1 and n=28 for C2. A vector $\underline{c}$ with length n is a code word in code C1 (if n=32) or in C$\overline{2}$ (if n=28) if and only if $\underline{c}H^T_n=\underline{0}$. The vector $\underline{c}$ comprises n components that are ordered as follows: $\underline{c}=[c_{n-1}c_{n-2} \ldots c_2c_1c_0]$, where $c_{n-1}$ is transmitted first and $c_0$ is transmitted last. This notation differs from the one conventionally used in CD publications, but covers exactly the same operations. Both codes have a minimum distance d=5, and, as a result, the code words contain four parity symbols each. In c1, they are the four lower order symbols of the code word $c_3, c_2, c_1, c_0$. In C2, they are the four middle order symbols of the code word, i.e., $c_{15}, c_{14}, c_{12}$.

Hereinafter, the order of a symbol is to be understood as its rank in the unshortened code word. Any other presentation sequence can be effected by conventional memory access technology. Furthermore, in all methods and devices contemplated hereinafter, encoding is based largely on retrocoupled shift registers that implement the generator polynomial of the code. Further, various different code word configurations are possible where the parity symbols are contiguous but other than the low order symbols of the code word only. Such (regular) code words, may form part of a full-length or shortened BCH code word, or, as the case may be, of a Reed-Solomon code word.

DESCRIPTION OF THE PREFERRED EMBODIMENT

Figure 2:
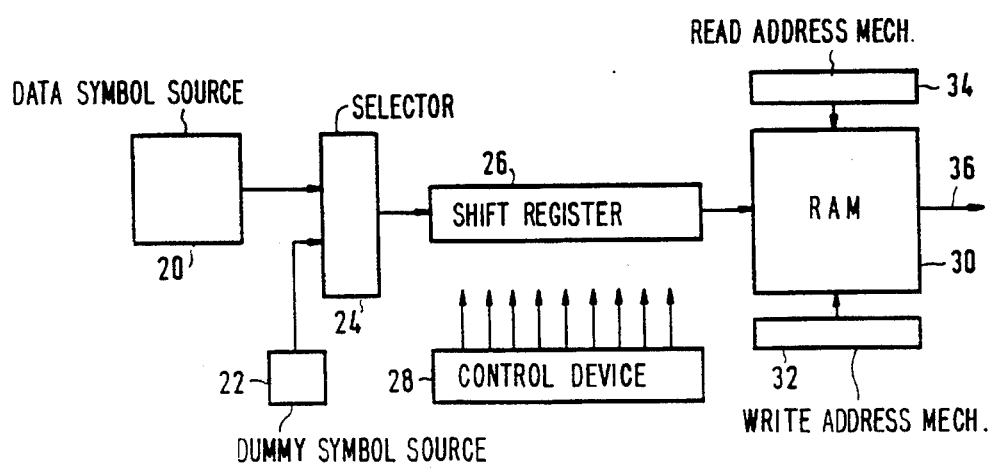
FIG. 2 shows a general set-up of an encoder system.

FIG. 2 shows a general set-up of an encoder system. Block 20 symbolizes a data source that presents the data symbols according to requirements from a general control device 28 (control connections are not shown for brevity). Block 22 symbolizes a source or dummy symbols, which general control device 28 would know the instant of appearance and the information content. (A particularly simple solution would be that all dummy symbols have a value zero, but this is not a strict requirement.) Block 24 symbolizes a selector which selects, under control by general control device 28, the appropriate symbols from sources 20 or 22 for presentation to a retrocoupled shift register 26, which is advanced one position for each symbol received. In certain situations, for a received symbol, a plurality of symbol shifts could be actuated, while also backward shifting can be feasible, as will be explained hereinafter. At the output of the shift register 26, a random addressable memory 30 is connected which has a first separate addressing mechanism 32 for writing and a second separate mechanism 34 for reading. When reading, the code word symbols are presented at output 36. Likewise, block 20 can be executed as a double access memory, which has an input from the outside not shown. In case of product coding and/or interleaved coding, the output 36, after the first encoding operation, can be retrocoupled to block 24, so that, in fact blocks 20 and 30 can be a single double access memory provided with only an output for outputting finalized code words and an internal connection to block 24. Of course, in that case block 22 can also form a part of the random access memory.

Figure 3:
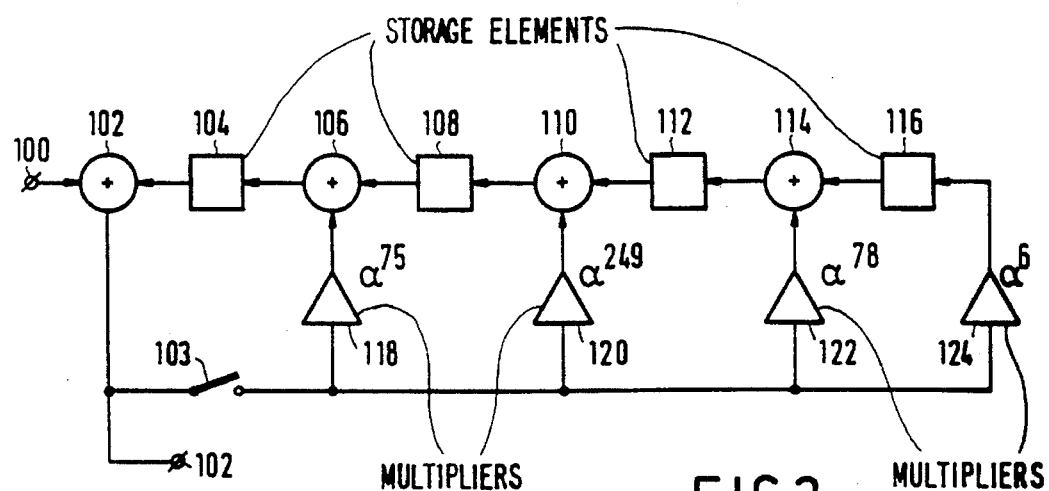
FIG. 3 shows a first shift register embodiment of the invention.

FIG. 3 shows a shift register arrangement for use in obtaining a C2 code word (such as the code word of FIG. 1b) according to the Compact Disc standard, and for implementing the scheme discussed with respect to FIG. 1c. As shown, the retrocoupled shift register comprises alternatingly storage elements 104, 108, 112 ad 16 and EXOR-gates 102, 106, 110 and 114. The EXOR's are internal to the shift register. (A realization with the EXOR's external to the shift register will be shown and discussed later). The input is at 100. The feedback is by means of Galois field multipliers 118, 120, 122 and 124, as shown, having multiplying factors equal to the coefficients of the generator polynomial's terms. To obtain the parity symbols for the C2 word, the system presents symbols at the input of the circuit in the following order: first $C_{11}, \ldots c_0$, then 227 zeroes, and finally, symbols $c_{27}, \ldots, c_{16}$. During this presentation, switch 103 is permanently closed. After symbol $c_{16}$ has been clocked in, switch 103 is opened. At that time, the shift register contains the parity symbols $c_{15}, \ldots, c_{12}$, from left to right in the storage elements 104, 108, 112 and 116, respectively. Shifting out these parity symbols along the shift register elements makes them available for further use. For simplicity, clocking and reset features were omitted. The correct sequence of the symbols (data and parity) for the code word is obtained by correctly selecting those symbols via selective memory access as explained with respect to FIG. 2. The powers of $\alpha$ in the multipliers 118, 120, 122 and 124 are exactly those occurring in the generator polynomial of the code.

Figure 4:
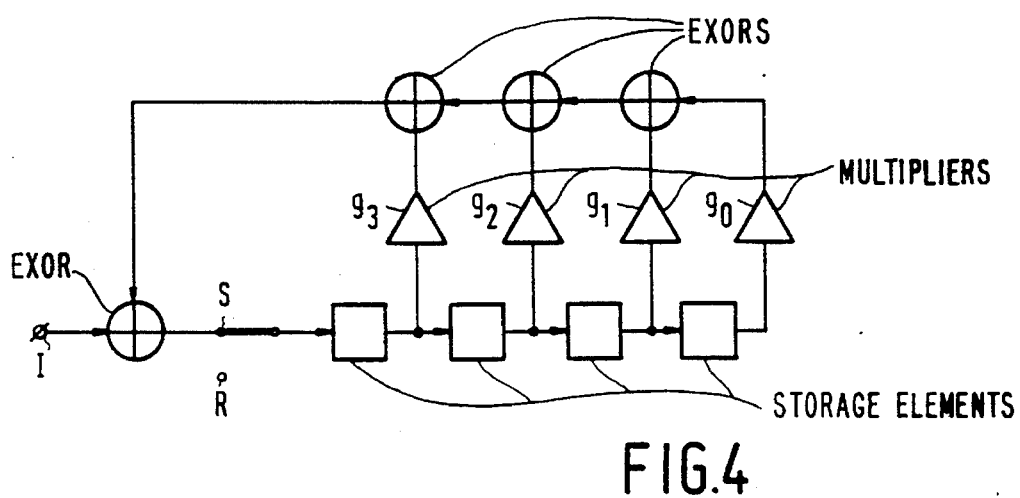
FIG. 4 shows a second shift register embodiment of the invention.
Figure 5:
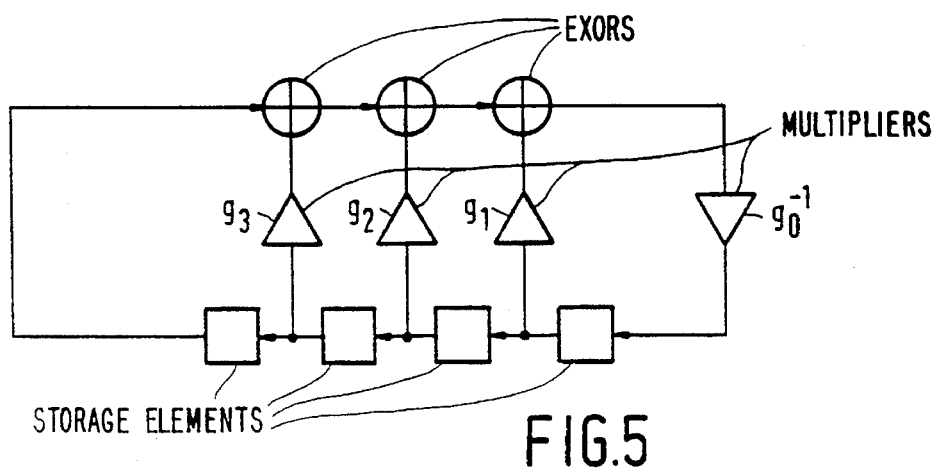
FIG. 5 shows a third shift register embodiment of the invention.

FIGS. 4 and 5 show a second shift register embodiment, which has a provision for forward and backward shifting. Moreover, this embodiment has the EXOR's external to the shift register. For forward shifting, the movement of the symbols (8 bits wide) is as indicated in FIG. 4. The data symbols to be encoded arrives at an input I, for generating the provisional parity symbols (i.e., a remainder), switch S is then in the upper position. If, after the backwards shift, the correct parity symbols (i.e., a remainder) have been produced, switch S is in the lower position. The EXORs, multipliers and delays of FIG. 4 are depicted as in FIG. 3. During backward shifting, the setup is as shown in FIG. 5. Although FIGS. 4 and 5 look quite similar (apart from a multiplier for go in FIG. 4 and a multiplier for $g_o^{-1}$ in FIG. 5), the upper three EXOR's and all four delay stages reverse their direction of operation.

Figure 6:
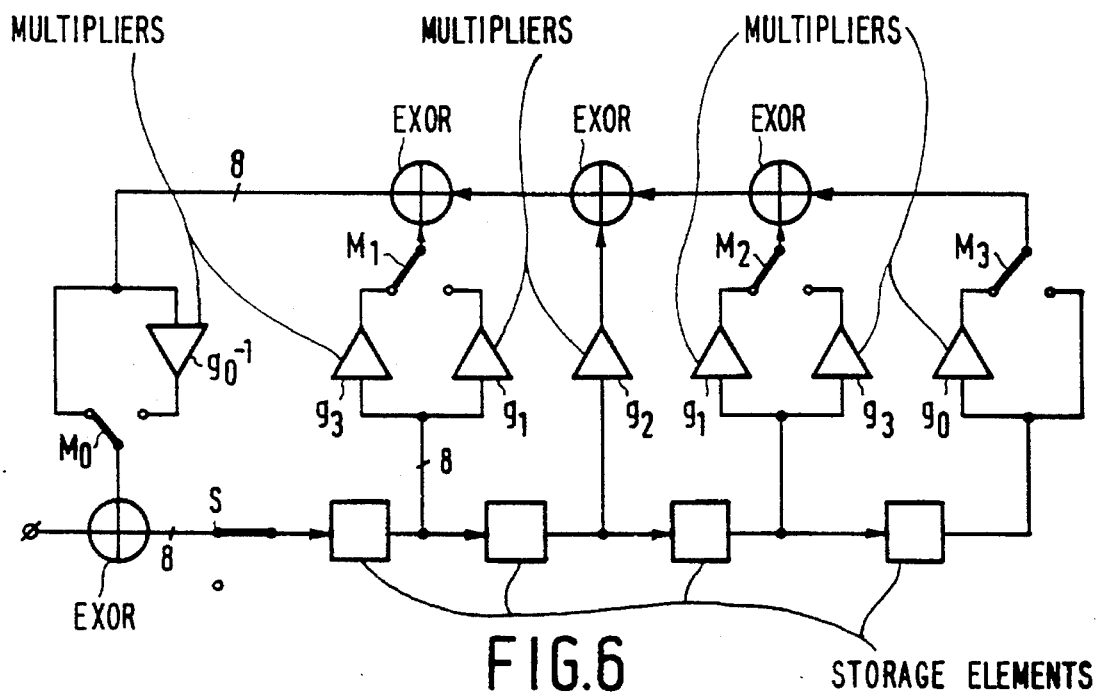
FIG. 6 shows a fourth shift register embodiment of the invention.

FIG. 6 shows a more straightforward solution that requires less hardware. Both the EXORs and delay stages operate unidirectionally. Forward shifting is done by putting all multiplexer switches $M_0$, $M_1$, $M_2$ and M, in their left hand position. Backward shifting has all four multiplexer switches $M_0$, $M_1$, $M_2$, and $M_3$ in their right hand position. The operation of switch S is as in FIGS. 3 and 4. Three of the multipliers occur only once, only those for g and $g_3$ are provided twice.

Figure 7:
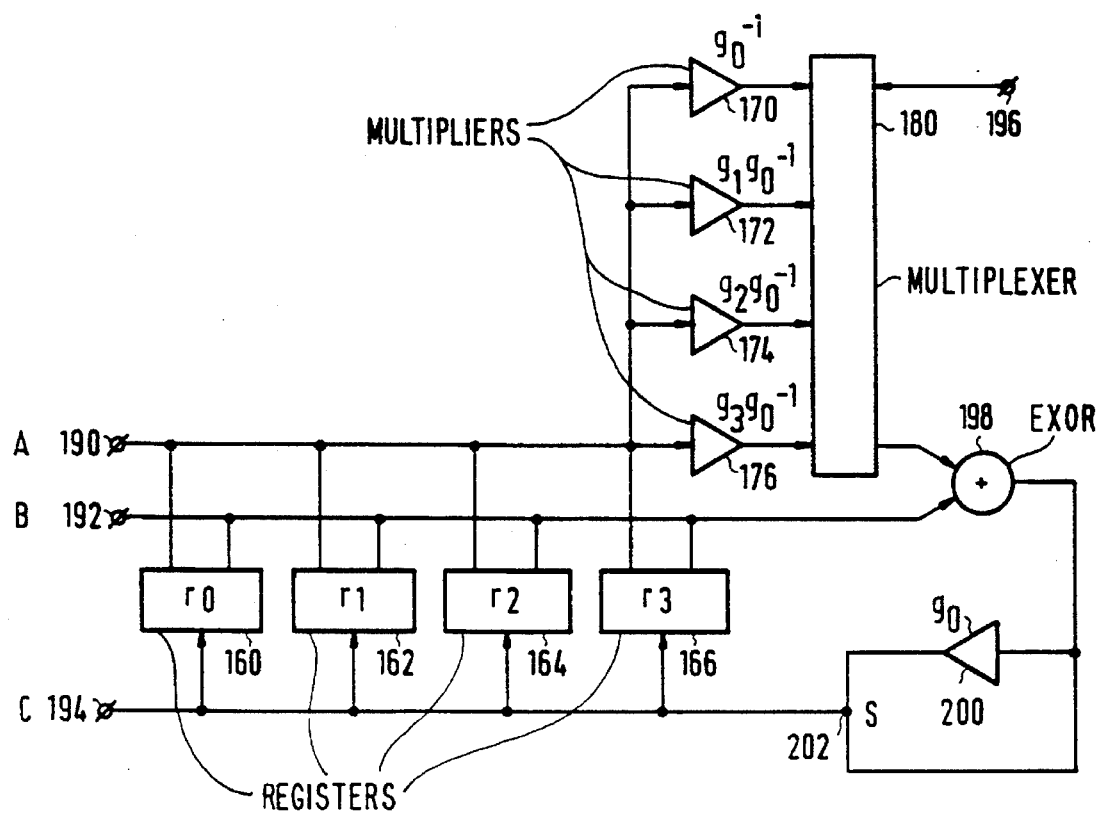
FIG. 7 shows a sequencer shift register embodiment of the invention.

FIG. 7 shows a further shift register embodiment, in particular, a sequencer type approach for realizing the procedure shown with reference to FIG. 1d. The set-up has three buses A(190), B(192) and C(194), four eight-bit three-state registers 160–166, one eight-bit wide EXOR gate 198, four multipliers 170–176 with multiplication factors as indicated, one eight-bit wide five-to-one multiplexer 180 with external input 196, one eight-bit two-to-one multiplexer or switch 202, and one further multiplier 200. As before, no control lines or synchronization lines have been shown. The set-up operates, in fact, through use of the same multiplication factors as described with respect to FIGS. 4 and 5. If switch 202 is in the lower position, the symbol received from stage r0...r3 on lower bus 192 is added through EXOR 198 and transmitted straight back through bus 194 to its previous storage position. If the switch 202 is in the upper position, and additional multiplication factor $g_0$ is introduced. The upper input to EXOR 198 emanates from multiplexer 180. This allows the received symbol to be selectively multiplied by any of factors $g_0^{-1}$, $g_1g_0^{-1}$, $g_2g_0^{-1}$ and $g_3g_0^{-1}$. Combination with multiplier 200 yields multiplying factors 1, $g_1$, $g_2$ and $g_3$, respectively. Through appropriate control for multiplexer 180 and switch 202, as well as selection of the appropriate storage element 160 ... 166, all operations corresponding to those of FIGS. 4–6 can be effected. As required, the device input can be at B, and the device output can be at C. For simplicity, multiplexer 202 has only been drawn very schematically, with control signal S.

It is noted that although the discussion and embodiment discussed above pertained primarily only to Reed-Solomon codes, it is applicable to other BCM codes. In addition, it is noted that the invention described herein is limited to codes that are systematic on the symbol level, wherein a conceptual dichotomy exists between data symbols and parity symbols.

We claim:

1. A method of encoding data symbols in accordance with a BCH code to obtain a code word having a code word order in which parity symbols for the code word are interposed between a first portion of the data symbols and a second portion of the data symbols, the method employing use of a shift register and comprising the steps of:

sequentially providing the data symbols to the shift register in a predetermined order in which the second portion precedes the first portion and zero data symbols are located in between the second portion and the first portion;

initially modifying each of the data symbols and zero data symbols as each is provided to the shift register based upon at least one of data symbols and zero data symbols previously provided to the shift register;

sequentially shifting the data symbols and zero data symbols, after initial modification, through the shift register in accordance with the predetermined order, and further modifying each of the data symbols and zero data symbols as each is shifted through the shift register based upon at least one of data symbols and zero data symbols later provided to the shift register to produce the parity symbols; and positioning the parity symbols with respect to the data symbols in accordance with the code word order so that the parity symbols are interposed between the first portion and the second portion to obtain the code word.

2. The method as claimed in claim 1, wherein said positioning step includes the steps of:

storing the data symbols and the parity symbols in a memory; and reading the data symbols and the parity symbols out of the memory in accordance with the code word order so that the parity symbols are interposed between the first portion and the second portion to obtain the code word.

3. The method as claimed in claim 1, wherein the BCH code has a generator polynomial, and said initial modifying, shifting and further modifying steps are such that they perform symbolwise multiplication of the data symbols by the generator polynomial.

4. A method of encoding data symbols in accordance with a BCH code to obtain a code word having a code word order in which parity symbols are interposed between a first portion of the data symbols and a second portion of the data symbols, the method employing use of a shift register and comprising the steps of:

sequentially providing the data symbols to the shift register in a predetermined order in which the first portion precedes the second portion and a number of dummy symbols are located in between the first portion and the second portion, subsequent to modifying each of the data symbols and dummy symbols based upon at least one of data symbols and dummy symbols previously provided to the shift register;

sequentially shifting the data symbols and dummy symbols, after modification, in accordance with the predetermined order through the shift register to produce provisional parity symbols;

backward shifting the provisional parity symbols through the shift register to produce the parity symbols; and positioning the parity symbols with respect to the data symbols in accordance with the code word order so that the parity symbols are located in between the first portion and the second portion to obtain the code word.

5. The method as claimed in claim 4, wherein the code word has an equal number of dummy symbols and parity symbols.

6. The method as claimed in claim 4, wherein said positioning step includes the steps of:

storing the data symbols and the parity symbols in a memory; and reading the data symbols and the parity symbols out of the memory in accordance with the code word order so that the parity symbols are interposed between the first portion and the second portion to obtain the code word.

7. The method as claimed in claim 4, wherein the BCH code has a generator polynomial, and said modifying and shifting steps are such that they perform symbolwise multiplication of the data symbols by the generator polynomial.

8. The method as claimed in claim 4, wherein the provisional parity symbols are modified during said backward shifting step.

9. The method as claimed in claim 4, wherein the BCH code has a polynomial generator, and said backward shifting step is such that it performs symbolwise division of the provisional parity symbols by a reciprocal of the generator polynomial.

10. The method as claimed in claim 4, wherein said backward shifting step occurs as many times as there are data symbols in the second portion.

11. A device for encoding data symbols in accordance with a BCH code to obtain a code word having a code word order in which parity symbols for the code word are interposed between a first portion of the data symbols and a second portion of the data symbols, the device comprising:

parity determining means for (a) receiving the data symbols in a predetermined order in which the second portion precedes the first portion and zero data symbols are located in between the second portion and the first portion, and (b) producing the parity symbols therefrom, said parity determining means including a shift register which (a) sequentially receives the data symbols and zero data symbols in accordance with the predetermined order, and initially modifies each of the data symbols and zero data symbols upon receipt based upon at least one of data symbols and zero data symbols previously received by said shift register; and (b) sequentially shifts each of the data symbols and zero data symbols, after initial modification, through said shift register in accordance with the predetermined order, and further modifies each of the data symbols and zero data symbols as each is shifted through said shift register based upon at least one of data symbols and zero data symbols later received by said shift register to produce the parity symbols; and positioning means for positioning the parity symbols with respect to the data symbols so that the parity symbols are interposed between the first portion and the second portion to obtain the code word.

12. The device as claimed in claim 11, wherein said parity determining means further includes n multipliers, and said shift register comprises n EXORs and n memory elements coupled to one another, where n corresponds to how many parity symbols are in the code word, the multipliers being used to provide said shift register with data for use in further modifying each of the data symbols and zero data symbols as each is shifted through said shift register, one of said EXORs being used to initially modify each of the data symbols and zero data symbols upon receipt by said shift register, n–1 of said EXORs being used to further modify each of the data symbols and zero data symbols as each is shifted through said shift register and said n memory elements being used to temporarily store the data symbols and the zero data symbols as each is shifted through said register and modified by said EXORs.

13. The device as claimed in claim 11, wherein said parity determining means (a) determines a contribution from each of the data symbols to the parity symbols, and (b) utilizes the contribution from each of the data symbols to produce the parity symbols.

14. The device as claimed in claim 11, wherein the BCH code has a polynomial generator, and said parity determining means performs symbolwise multiplication of the data symbols by the generator polynomial.

15. The device as claimed in claim 11, wherein said positioning means is a memory which (a) stores the parity symbols and the data symbols and (b) reads the data symbols and the parity symbols out of the memory in accordance with the code word order so that the parity symbols are interposed between the first portion and the second portion to obtain the code word.

16. A device for encoding data symbols in accordance with a BCH code to obtain a code word having a code word order in which parity symbols for the code word are interposed between a first portion of the data symbols and a second portion of the data symbols, the device comprising:

parity determining means for (a) receiving the data symbols in a predetermined order in which the first portion precedes the second portion and dummy symbols are located in between the first portion and the second portion, and (b) producing the parity symbols therefrom, said parity determining means including a shift register which (a) sequentially receives and shifts there-through the data symbols and dummy symbols in the predetermined order to produce provisional parity symbols, and (b) backward shifts therethrough the provisional parity symbols to produce the parity symbols; and modification means for modifying the data symbols and dummy symbols prior to each being received by said shift register based upon at least one of data symbols and dummy symbols previously received by said shift register; and positioning means for positioning the parity symbols with respect to the data symbols so that the parity symbols are interposed between the first portion and the second portion to obtain the code word.

17. The device as claimed in claim 16, wherein the code word has an equal number of dummy symbols and parity symbols.

18. The device as claimed in claim 16, wherein said modification means includes n multipliers and n EXORs coupled to one another for use in modifying the data symbols and dummy symbols, and said shift register includes n memory elements for use in shifting the data symbols through said shift register, where n corresponds to how many parity symbols are in the code word.

19. The device as claimed in claim 16, wherein said parity determining means (a) determines a contribution from each of the data symbols to the provisional parity symbols, and (b) utilizes the contribution from each of the data symbols to produce the provisional parity symbols.

20. The device as claimed in claim 16, wherein the BCH code has a generator polynomial, and said parity determining means performs symbolwise multiplication of the data symbols by the generator polynomial.

21. The device as claimed in claim 16, wherein said modification means modifies the provisional parity symbols during backward shifting thereof through said shift register.

22. The device as claimed in claim 21, wherein said parity determining means includes n multipliers and n–1 EXORs coupled together for use in modifying the provisional parity symbols during backward shifting thereof through said shift register, and said shift register includes n memory elements for use in backward shifting the provisional parity symbols through said shift register, where n corresponds to how many parity symbols are in the code word.

23. The device as claimed in claim 16, wherein said shift register performs symbolwise division of the provisional parity symbols by a reciprocal for a generator polynomial for the BCH code.

24. The device as claimed in claim 16, wherein said positioning means is a memory which (a) stores the parity symbols and the data symbols and (b) reads the data symbols and the parity symbols out of the memory in accordance with the code word order so that the parity symbols are interposed between the first portion and the second portion to obtain the code word.

25. A device for encoding data symbols in accordance with a BCH code to obtain a code word having a code word order in which parity symbols for the code word are interposed between a first portion of the data symbols and a second portion of the data symbols, the device comprising:

a shift register bank which (a) receives the data symbols in a predetermined order in which the first portion precedes the second portion and a number of dummy symbols are located in between the first portion and the second portion and (b) produces the parity symbols therefrom, said shift register bank including one symbol register for each of the parity symbols; and positioning means for positioning the parity symbols with respect to the data symbols so that the parity symbols are interposed between the first portion and the second portion to obtain the code word.

26. The device as claimed in claim 25, wherein the code word has an equal number of dummy symbols and parity symbols.

\* \* \* \* \*